(12) United States Patent
Jin et al.

(10) Patent No.: US 10,122,191 B2
(45) Date of Patent: Nov. 6, 2018

(54) BATTERY PROTECTION CIRCUIT

(71) Applicant: SAMSUNG SDI CO., LTD., Yongin-si, Gyeonggi-do (KR)

(72) Inventors: Kyong-Pil Jin, Yongin-si (KR); Myung-Sang Lee, Yongin-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 52 days.

(21) Appl. No.: 15/361,514

(22) Filed: Nov. 28, 2016

(65) Prior Publication Data

US 2017/0201104 A1 Jul. 13, 2017

(30) Foreign Application Priority Data

Jan. 7, 2016 (KR) .................. 10-2016-0002271

(51) Int. Cl.
*H02J 7/00* (2006.01)
*H01M 10/42* (2006.01)
(Continued)

(52) U.S. Cl.
CPC ......... *H02J 7/0029* (2013.01); *H01M 10/425* (2013.01); *H02J 7/0031* (2013.01);
(Continued)

(58) Field of Classification Search
CPC ............... H02J 7/0029; H02J 7/0052; H02J 2007/0059; H01M 10/425; H01M 2010/4271
(Continued)

(56) References Cited

U.S. PATENT DOCUMENTS 5,764,033 A * 6/1998 Tamai ................ G01R 31/3648
320/132
5,828,202 A * 10/1998 Tamai .................. H02J 7/0029
320/134
(Continued)

FOREIGN PATENT DOCUMENTS

CN 102709977 A 10/2012
CN 102055211 B 4/2015
(Continued)

OTHER PUBLICATIONS

Notice of Allowance dated Mar. 22, 2017, of the corresponding Korean Patent Application No. 10-2016-0002271.
(Continued)

*Primary Examiner* — Sun Lin
(74) *Attorney, Agent, or Firm* — Lee & Morse, P.C.

(57) ABSTRACT

A battery protection circuit includes a voltage source, a first resistor, a charging controller, a first charging transistor, a second resistor, and a current voltage converter. The first resistor includes a first terminal connected to the voltage source. The charging controller supplies a charging control current through a charging control terminal. The first charging transistor includes a gate terminal and a first terminal. The second resistor is connected between the gate terminal and first terminal of the first charging transistor. The current voltage converter is connected to a second terminal of the first resistor to electrically connect the voltage source to the gate terminal of the first charging transistor depending on the charging control current.

15 Claims, 4 Drawing Sheets

(51) Int. Cl.
*H03K 17/041* (2006.01)
*H03K 17/10* (2006.01)
*H03K 17/687* (2006.01)
*H02H 3/05* (2006.01)

(52) U.S. Cl.
CPC ...... *H02J 7/0052* (2013.01); *H03K 17/04106* (2013.01); *H03K 17/102* (2013.01); *H03K 17/6877* (2013.01); *H01M 2010/4271* (2013.01); *H02H 3/05* (2013.01); *H02J 2007/0037* (2013.01); *H02J 2007/0059* (2013.01); *H05K 999/99* (2013.01)

(58) Field of Classification Search
USPC ........................................................ 320/162
See application file for complete search history.

(56) References Cited

U.S. PATENT DOCUMENTS

| | | | | |
|---|---|---|---|---|
| 6,285,165 | B1* | 9/2001 | Terada | H02J 7/0029 320/134 |
| 8,674,661 | B2 | 3/2014 | Yamada | |
| 2005/0116764 | A1 | 6/2005 | Nagai et al. | |
| 2005/0156574 | A1 | 7/2005 | Sato et al. | |
| 2005/0242780 | A1 | 11/2005 | Sakuma et al. | |
| 2007/0019834 | A1 | 1/2007 | Nielson | |
| 2007/0035481 | A1 | 2/2007 | Kim | |
| 2010/0264887 | A1 | 10/2010 | Ohshima et al. | |
| 2014/0043007 | A1 | 2/2014 | Wei et al. | |
| 2014/0077769 | A1 | 3/2014 | Maleki et al. | |

FOREIGN PATENT DOCUMENTS

| | | | |
|---|---|---|---|
| JP | 2005-130664 | A | 5/2005 |
| JP | 2012-065447 | A | 3/2012 |
| KR | 10-2005-0005772 | A | 1/2005 |
| KR | 10-2005-0104302 | A | 11/2005 |
| KR | 10-2007-0019834 | A | 2/2007 |
| KR | 10-2015-0072409 | A | 6/2015 |

OTHER PUBLICATIONS

Office Action dated Dec. 13, 2016 of the corresponding Korean Patent Application No. 10-2016-0002271.
Tahmid Mahbub, "Tahmid's blog; Low-Side MOSFET Drive Circuits and Techniques—7 Practical Circuits",Dec. 22, 2012, 12 pgs.
Extended European Search Report dated Jun. 2, 2017, of the corresponding European Patent Application No. 17150568.8.

* cited by examiner

BATTERY PROTECTION CIRCUIT

CROSS-REFERENCE TO RELATED APPLICATION

Korean Patent Application No. 10-2016-0002271, filed on Jan. 7, 2016, and entitled: "Battery Protection Circuit," is incorporated by reference herein in its entirety.

BACKGROUND

1. Field

One or more embodiments described herein relate to a battery protective circuit.

2. Description of the Related Art

A battery protection circuit protects a battery cell from a short-circuit, disconnection, over-current, over-voltage, or another type of malfunction that may occur, for example, during charging and/or discharging operations. One type of battery protection circuit includes a charging and discharging controller (e.g., a battery integrated circuit (IC)) to perform various battery protection operations.

A relatively inexpensive battery protection circuit includes a non-smart battery IC. This kind of IC may exclusively perform a protection function without a micro controller unit (MCU). This type of IC may employ an open-drain-type current source method under control of a charging transistor in attempt to reduce power consumption. However, this and other types of battery protection circuits have drawbacks.

SUMMARY

In accordance with one or more embodiments, a battery protection circuit includes a voltage source; a first resistor including a first terminal connected to the voltage source; a charging controller to supply charging control current through a charging control terminal; a first charging transistor including a gate terminal and a first terminal; a second resistor connected between the gate terminal and first terminal of the first charging transistor; and a current voltage converter connected to a second terminal of the first resistor to electrically connect the voltage source to the gate terminal of the first charging transistor depending on the charging control current.

The battery protection circuit may include a second charging transistor having a gate terminal and a first terminal; and a third resistor connected between the gate terminal and the first terminal of the second charging transistor, wherein a second terminal of the second charging transistor is electrically connected to the first terminal of the first charging transistor, and wherein the gate terminal of the second charging transistor is electrically connected to the gate terminal of the first charging transistor.

The current voltage converter may include a first transistor including a first terminal electrically connected to a second terminal of the first resistor; a second transistor including a first terminal electrically connected to a second terminal of the first transistor; and a fourth resistor including a first terminal electrically connected to a second terminal of the second transistor and a second terminal electrically connected to the gate terminals of the first and second transistors and the charging control terminal. The voltage source may include a capacitor, and the capacitor may be electrically connected to positive electrode of a battery cell to maintain a voltage. The charging controller may include a power-supply terminal, and the charging controller may receive power from the voltage source through the power-supply terminal to generate the charging control current. The voltage source may include a diode and a fifth resistor.

A first terminal of the power-supply terminal and the first terminal of the first resistor may be electrically connected to a first terminal of the capacitor. The first transistor may be enabled when the charging control current is in an on level and the first and second charging transistors are enabled. The second transistor may be enabled when the charging control current is in an off level and the first and second charging transistors are disabled. The second resistor may have a resistance value greater than that of the fourth resistor. The second resistor may have a resistance value greater than that of the first resistor.

In accordance with one or more other embodiments, a battery protection circuit includes a first resistor connected to a voltage source; a first charging transistor connected to a battery terminal; a second resistor connected to the first charging transistor; a controller connected to the voltage source to supply charging control current; and a converter to connect the voltage source to the first charging transistor based on the charging control current, wherein the first resistor has a resistance value less than the second resistor and wherein a time constant of the first charging transistor is based on the resistance value of the first resistor.

The battery protection circuit may include a second charging transistor; and a third resistor connected to the second charging transistor, wherein gate terminals of the first and second charging transistors are connected to the converter. The resistance value of the first resistor may be less than a resistance value of the third resistor. The converter may include a first transistor connected to the first resistor; a second transistor connected between the first transistor and the second and third resistors; and a fourth resistor connected between the controller and gate terminals of the first and second transistors.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
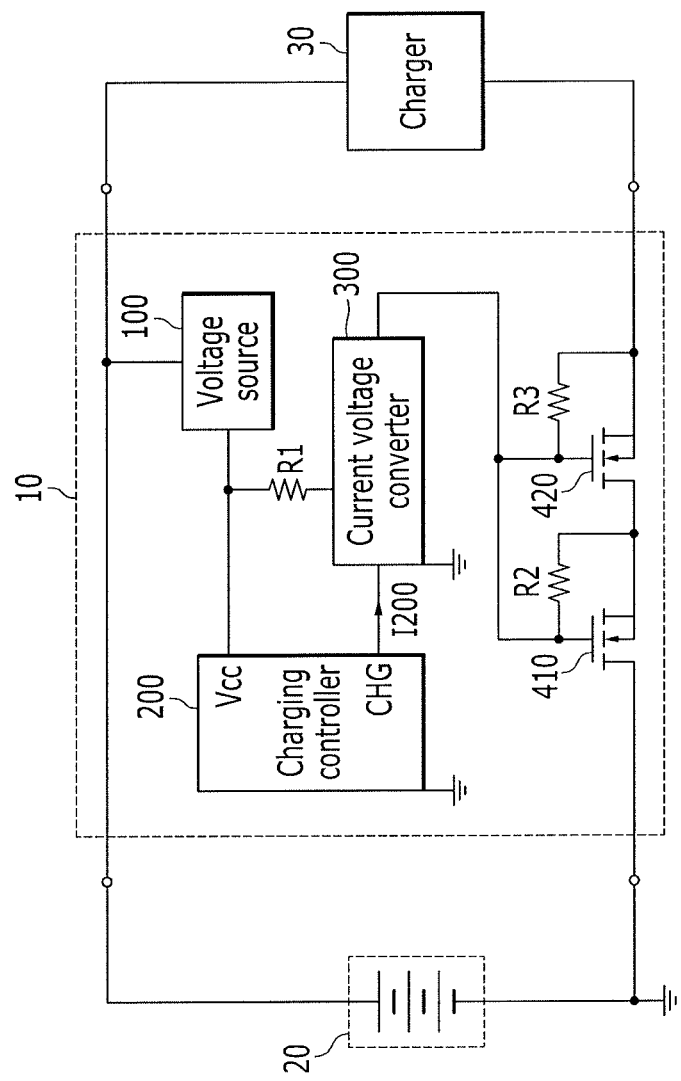
FIG. 1A illustrates an embodiment of a battery protective circuit.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1A illustrates an embodiment of a battery protective circuit 10 which includes a voltage source 100, a charging controller 200, a current voltage converter 300, a first charging transistor 410, a first resistor R1, and a second resistor R2. The battery protective circuit 10 may further include a second charging transistor 420 and a third resistor R3 in order to prepare for an operation fail of the first charging transistor 410.

The battery protective circuit 10 is electrically interposed between a battery cell 20 and a charger 30 to protect the battery cell 20 from short-circuit, disconnection, over-current, over-voltage, or the like, that may occur during charging and discharging of the battery cell 20. In the battery protective circuit 10 of the present exemplary embodiment, portions related to charging control are selectively illustrated. The battery protective circuit 10 may further include a circuit configuration for performing another protective function. For example, the battery protective circuit may further include a discharge transistor, a fuse, a current/voltage sensing unit, and/or the like.

The voltage source 100 may supply voltages for operating the charging controller 200 and the current voltage converter 300. The voltage source 100 may supply a voltage to a power supply terminal Vcc of the charging controller 200 to allow for operation of the charging controller 200. The voltage source 100 may supply a voltage to the current voltage converter 300 through the first resistor R1, and the current voltage converter 300 may apply a voltage to gate terminals of the first charging transistor 410 and the second charging transistor 420.

The first resistor R1 has a first terminal connected to the voltage source 100. A second terminal of the first resistor R1 is connected to the current voltage converter 300. Enable speeds and disable speeds of the first and second charging transistors 410 and 420 may be determined according to a resistance value of the first resistor R1. This will be described in detail with reference to FIG. 1B. In one embodiment, the resistance value of the first resistor R1 may be smaller than that of the second resistor R2 or the third resistor R3.

The charging controller 200 supplies a charging control current I200 to the current voltage converter 300 through a charging control terminal CHG. The charging controller 200 may be a battery IC and may not include a micro controller unit to reduce costs. Further, the charging controller 200 may employ an open-drain-type current source method to reduce or minimize power consumption. The charging control current I200 may have an on level or an off level. For example, the charging control current I200 may be, for example, 6 uA in the case of an on level. When the charging controller 200 opens the charging control terminal CHG, the charging control current I200 may be in the off level by high impedance. The charging controller 200 may receive power from the voltage source 100 through the power supply terminal Vcc in order to generate the charging control current I200.

The second resistor R2 is connected between a gate terminal and a first terminal of the first charging transistor 410. The gate terminal of the first charging transistor 410 is connected to an output terminal of the current voltage converter 300. The second resistor R2 serves as a pull-down resistor for preventing the voltage of the gate terminal of the first charging transistor 410 from falling in an undefined state. The first terminal and a second terminal of the first charging transistor 410 may be electrically connected, for example, to a negative electrode of the battery cell 20. In one embodiment, the first charging transistor 410 may be, for example, between opposite ends of battery cell 20.

The third resistor R3 is connected between a gate terminal and a first terminal of the second charging transistor 420. The gate terminal of the second charging transistor 420 is connected to the output terminal of the current voltage converter 300. The third resistor R3 serves as a pull-down resistor for preventing a voltage of the gate terminal of the first charging transistor 420 from falling in an undefined state. The first terminal and a second terminal of the second charging transistor 420 may be electrically connected to the negative electrode of the battery cell 20. In one embodiment, the second charging transistor 420 may be between opposite ends of the battery cell 20. The second terminal of the second charging transistor 420 may be connected in series to the first terminal of the first charging transistor 410.

The current voltage converter 300 is connected to the second terminal of the first resistor R1 and electrically connects the voltage source 100 to the gate terminals of the first and second charging transistors 410 and 420 depending on the charging control current. For example, when the charging control current is at the on level, the current voltage converter 300 applies the voltage of the voltage source 100 to the gate terminals of the first and second charging transistors 410 and 420 to enable the first and second charging transistors 410 and 420. When the charging control current I200 is at the off level, the current voltage converter 300 disables the first and second charging transistors 410 and 420 by blocking the voltage of the voltage source 100.

In the exemplary embodiment of FIG. 1A, the charging control current I200 is converted to a voltage signal by the current voltage converter 300. The voltage signal is applied to the gate terminals of the first and second charging transistor 410 and 420, instead of directly applying the charging control current to the charging transistors. Accordingly, the first resistor R1 is exclusively considered, without considering the second and third resistors R2 and R3, in order to obtain time constants of the first and second charging transistors 410 and 420. Therefore, it is possible to secure the enable speed and disable speed of the first charging transistor 410 by appropriately adjusting the resistance value of the first resistor R1.

Figure 1B:
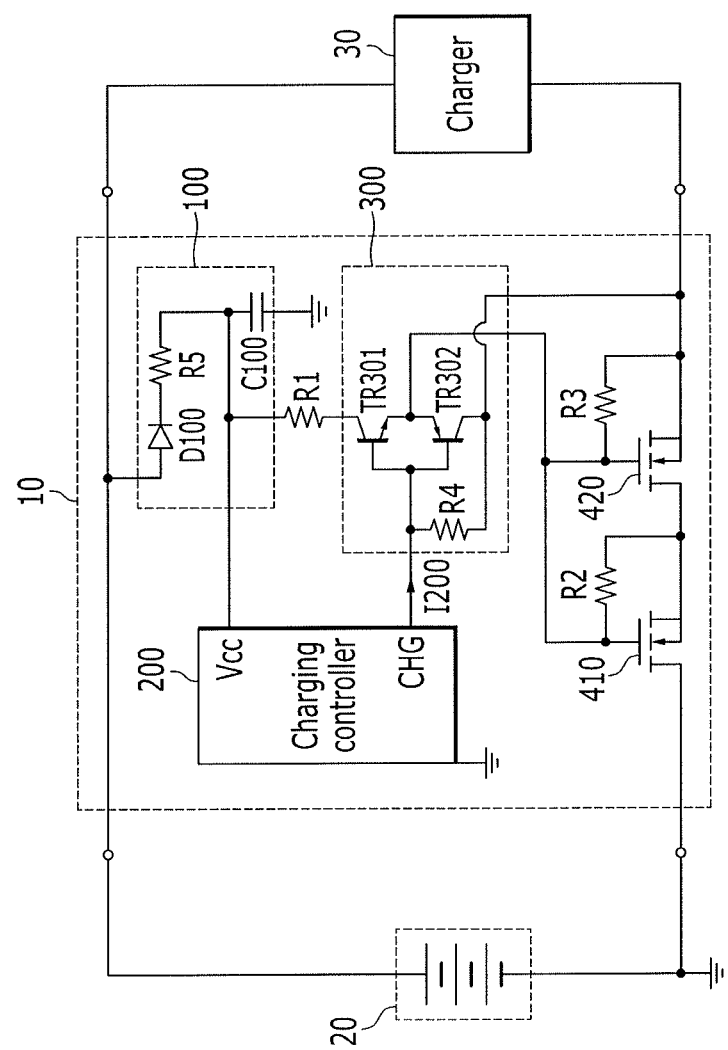
FIG. 1B illustrates another embodiment of a battery protective circuit.

FIG. 1B illustrates a more detailed embodiment of the battery protective circuit in FIG. 1A. Referring to FIG. 1B, an exemplary circuit of the voltage source 100 and the current voltage converter 300 is illustrated.

The current voltage converter 300 includes a first transistor TR301, a second transistor TR302, and a fourth resistor R4. The first transistor TR301 may be a NPN transistor, and a first terminal and a second terminal thereof may be respectively connected to the second terminal of the first resistor R1 and a first terminal of the second transistor TR302. The second transistor TR302 may be a PNP transistor and a first terminal thereof may be connected to the first transistor TR301. A second terminal of the second transistor TR302 may be electrically connected to the first terminal of the fourth resistor R4 and the negative electrode of the battery cell 20. A second terminal of the fourth resistor R4, a gate terminal of the first transistor TR301, and a gate terminal of the second transistor TR302 are connected to the charging control terminal CHG. In one embodiment, the fourth resistor R4 and the second resistor R2 may have different resistance values, e.g., the fourth resistor R4 may have a resistance value less than that of the second resistor R2.

The voltage source 100 includes a diode D100, a fifth resistor R5, and a capacitor C100, which are sequentially connected in series to a positive electrode of the battery cell 20. The capacitor C100 is electrically connected to the positive electrode of the battery cell 20 to maintain the voltage. The first terminals of the power supply terminal Vcc and the first resistor R1 are electrically connected to a first terminal of the capacitor C100.

In operation, when the battery cell 20 is to be charged, the charging controller 200 outputs the on-level charging control current I200 through the charging control terminal CHG. Accordingly, the first transistor TR301 is enabled and the second transistor TR302 is disabled. The voltage maintained in the capacitor C100 is applied to the gate terminals of the first and second charging transistors 410 and 420 through the first resistor R1 and the first transistor TR301, to enable the first and second charging transistors 410 and 420.

When the battery cell 20 is separated from the charger 30, the charging controller 200 opens the charging control terminal CHG to change the charging control current I200 to the off level. Accordingly, the second transistor TR302 is enabled and the first transistor TR301 is disabled. A relatively low voltage is applied to the gate terminals of the first and second charging transistor 410 and 420 through the second transistor TR302. Accordingly, the first and second charging transistors 410 and 420 are disabled.

The time constants at which the first and second charging transistors 410 and 420 are enabled may be obtained as follows. For example, when the resistance value of the first resistor R1 is 10 Kohm and a parallel sum of parasitic capacitances of the first and second charging transistors 410 and 420 is 12.8 nF, the time constant is substantially obtained as 128 us by the equation: 12.8 nF*10 Kohm. When a parasitic capacitance component of the first transistor TR301 and a parasitic resistor component are reflected, a greater time constant may be obtained but this value may be significantly less than 51.2 ms. As a result, according to the present exemplary embodiment, it is possible to secure enable speeds and disable speeds of the charging transistors 410 and 420, even when two or more charging transistors 410 and 420 are employed.

Although a method for effectively increasing the enable speed and disable speed of the charging transistor for a charging control has been described, the same principle may be applied to increase the enable speed and disable speed of a discharging transistor in a discharging control.

The controllers, converters, and other processing features of the embodiments described herein may be implemented in logic which, for example, may include hardware, software, or both. When implemented at least partially in hardware, the controllers, converters, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, converters, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Figure 2A:
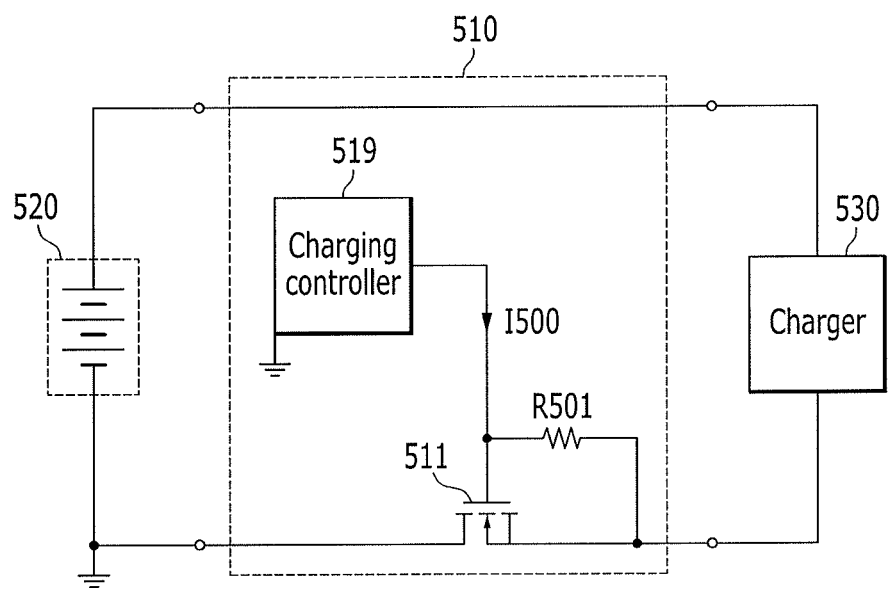
FIGS. 2A and 2B illustrate other types of battery protective circuits.
Figure 2B:
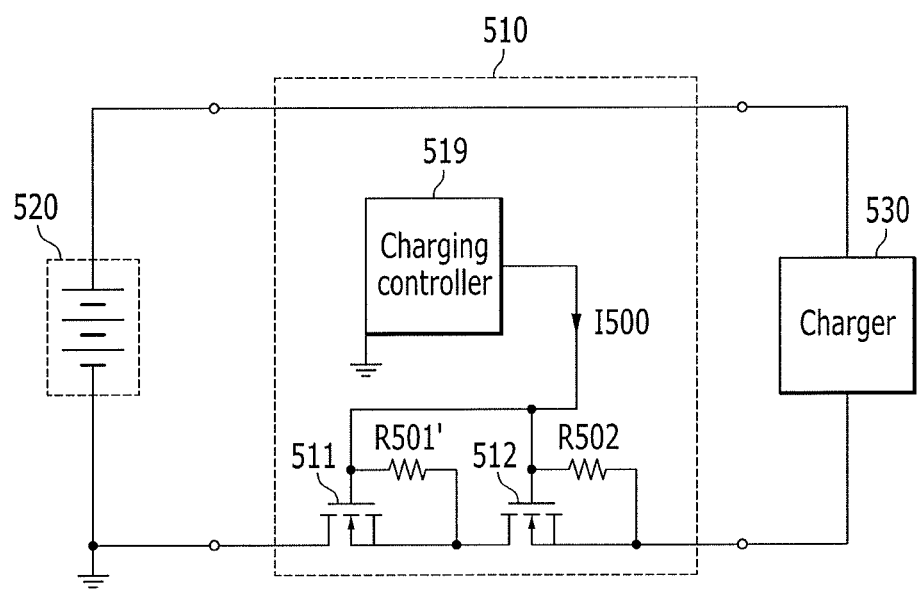

By way of summation and review, various types of battery protection circuits have been developed. FIGS. 2A and 2B illustrate two types of battery protection circuits.

Referring to FIG. 2A, a battery protective circuit 510 is electrically connected between a battery cell 520 and a charger 530. A charging controller 519 supplies a charging control current I500 to a gate terminal of a charging transistor 511. When the charging control current I500 is at an on level, the charging transistor 511 is enabled by a voltage formed through a resistor R501 to start charging of a battery cell 520 from the charger 530. For example, when the voltage level at which the charging transistor 511 is enabled is 11 V, the charging transistor 511 may be enabled by setting the charging control current I500 as 6 uA and the resistor R501 as 2 Mohm, and applying a voltage of 12 V to the gate terminal of the charging transistor 511.

When the charging control current I500 is at an off level, the resistor R501 serves to fix a voltage of the gate terminal of the charging transistor 511 as a ground voltage. Accordingly, the charging transistor 511 is disabled and electrically disconnects the charger 530 and the battery cell 520.

Referring to FIG. 2B, the battery protective circuit 510 may include a charging transistor 512 to prepare for a Fail where the charging transistor 511 is short-circuited. The charging transistors 511 and 512 are simultaneously enabled or disabled according to the level of the charging control current I500.

However, as shown in FIG. 2B, the charging control current I500 is divided in half and supplied to the charging transistors 511 and 512. Accordingly, a sufficient voltage is not applied to the gate terminals of the charging transistors 511 and 512. Thus, the charging transistors 511 and 512 are not enabled. For example, when the voltage level at which charging transistors 511 and 512 are enabled is 11 V, charging transistors 511 and 512 may be disabled when a divided current of 3 uA is supplied to each of the transistors 511 and 512 and a voltage of 6 V is applied to the gate terminals thereof.

Accordingly, the charging transistor 511 may include a resistor R501' as a pull-down resistor. In this case, the resistor R501' has a resistance value that is twice as much as that of the resistor R501 shown in FIG. 2A. Similarly, the charging transistor 512 may include a resistor R502 as a pull-down resistor. In this case, the resistor R502 has a resistance value that is twice as much as that of the resistor R501 in FIG. 2A. In this case, for example, even when the divided current of 3 uA is supplied to each of the transistors 511 and 512, since resistance values of the resistors R501' and R502 are 4 Mohm, a voltage of 12 V may be supplied to the gate terminals thereof to enable the charging transistors 511 and 512.

However, some problems may occur in an enable speed and disable speed of the charging transistors 511 and 512. The enable and disable speeds of the charging transistor 511 depend on a time constant caused by the resistor R501' and a parasitic capacitance component of the charging transistor 511. As compared with FIG. 2A, resistor R501' has a resistance value that is twice as much as that of the resistor R501, and a parasitic capacitance is increased by two times as the charging transistor 512 is added. Accordingly, the enable and disable speeds of the charging transistor 511 are significantly deteriorated.

For example, when the charging transistor 511 shown in FIG. 2A has a parasitic capacitance component of 6.4 nF, the resistance value of the resistor R501 is 2 Mohm. Accordingly, the time constant is substantially obtained as 12.8 ms by 6.4 nF*2 Mohm. However, a parallel sum of parasitic capacitances of the charging transistors 511 and 512 in FIG. 2B is 12.8 nF, and each resistance value of the resistors R501' and R502 is 4 Mohm. Accordingly, the time constant is substantially obtained as 51.2 ms by 12.8 nF*4 Mohm. Thus, in the case of FIG. 2B, the time constant of the charging transistors 511 and 512 may be 4 times greater than that in the case of FIG. 1A.

When the enable and disable speeds deteriorate, it is difficult to obtain proper timing of protective operation of the battery protective circuit 510. As a result, the battery protective circuit 510 may inappropriately perform a protective function.

In accordance with one or more of the aforementioned embodiments, a battery protection circuit is provided that may employ two or more charging transistors and acquire improved enable and disable speeds.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A battery protection circuit, comprising:
a voltage source;
a first resistor including a first terminal connected to the voltage source;
a charging controller to supply a charging control current through a charging control terminal;
a first charging transistor including a gate terminal and a first terminal;
a second resistor connected between the gate terminal and the first terminal of the first charging transistor; and
a current voltage converter connected to a second terminal of the first resistor to electrically connect the voltage source to the gate terminal of the first charging transistor depending on the charging control current.

2. The battery protection circuit as claimed in claim 1, further comprising:
a second charging transistor having a gate terminal and a first terminal; and
a third resistor connected between the gate terminal and the first terminal of the second charging transistor, wherein a second terminal of the second charging transistor is electrically connected to the first terminal of the first charging transistor, and wherein the gate terminal of the second charging transistor is electrically connected to the gate terminal of the first charging transistor.

3. The battery protection circuit as claimed in claim 2, wherein the current voltage converter includes:
a first transistor including a first terminal electrically connected to a second terminal of the first resistor;
a second transistor including a first terminal electrically connected to a second terminal of the first transistor; and
a fourth resistor including a first terminal electrically connected to a second terminal of the second transistor and a second terminal electrically connected to the gate terminal of the first charging transistor, the gate terminal of the second charging transistor, and the charging control terminal.

4. The battery protection circuit as claimed in claim 3, wherein:
the voltage source includes a capacitor, and
the capacitor is electrically connected to positive electrode of a battery cell to maintain a voltage.

5. The battery protection circuit as claimed in claim 4, wherein:
the charging controller includes a power-supply terminal, and
the charging controller receives power from the voltage source through the power-supply terminal to generate the charging control current.

6. The battery protection circuit as claimed in claim 5, wherein the voltage source includes a diode and a fifth resistor.

7. The battery protection circuit as claimed in claim 5, wherein a first terminal of the power-supply terminal and the first terminal of the first resistor are electrically connected to a first terminal of the capacitor.

8. The battery protection circuit as claimed in claim 7, wherein:
the first transistor is enabled when the charging control current is in an on level and the first charging transistor and the second charging transistor are enabled.

9. The battery protection circuit as claimed in claim 8, wherein the second transistor is enabled when the charging control current is in an off level and the first charging transistor and the second charging transistor are disabled.

10. The battery protection circuit as claimed in claim 3, wherein the second resistor has a resistance value greater than that of the fourth resistor.

11. The battery protection circuit as claimed in claim 1, wherein the second resistor has a resistance value greater than that of the first resistor.

12. A battery protection circuit, comprising:
a first resistor connected to a voltage source;
a first charging transistor connected to a battery terminal;
a second resistor connected to the first charging transistor;
a controller connected to the voltage source to supply a charging control current; and
a converter to connect the voltage source to the first charging transistor based on the charging control current, wherein the first resistor has a resistance value less than a resistance value of the second resistor and wherein a time constant of the first charging transistor is based on the resistance value of the first resistor.

13. The battery protection circuit as claimed in claim 12, further comprising:
a second charging transistor; and
a third resistor connected to the second charging transistor,
wherein a gate terminal of the first charging transistor and a gate terminal of the second charging transistor are connected to the converter.

14. The battery protection circuit as claimed in claim 13, wherein the resistance value of the first resistor is less than a resistance value of the third resistor.

15. The battery protection circuit as claimed in claim 13, wherein the converter includes:
- a first transistor connected to the first resistor;
- a second transistor connected between the first transistor and the second resistor and the third resistor; and
- a fourth resistor connected between the controller and gate terminals of the first and second transistors.

* * * * *